(12) United States Patent
Qiu et al.

(10) Patent No.: US 11,533,043 B2
(45) Date of Patent: Dec. 20, 2022

(54) METHOD FOR IMPEDANCE PREDICTION OF A VOLTAGE SOURCE CONVERTER UNDER VARIABLE OPERATING POINTS

(71) Applicant: Huazhong University of Science and Technology, Wuhan (CN)

(72) Inventors: Qi Qiu, Wuhan (CN); Meng Zhan, Wuhan (CN); Yifan Huang, Wuhan (CN); Yayao Zhang, Wuhan (CN)

(73) Assignee: HUAZHONG UNIVERSITY OF SCIENCE AND TECHNOLOGY, Wuhan (CN)

( * ) Notice: Subject to any disclaimer, the term of this patent is extended or adjusted under 35 U.S.C. 154(b) by 0 days.

(21) Appl. No.: 17/212,988

(22) Filed: Mar. 25, 2021

(65) Prior Publication Data
US 2022/0200579 A1 Jun. 23, 2022

(30) Foreign Application Priority Data
Dec. 17, 2020 (CN) .......................... 202011501543.3

(51) Int. Cl.
H03H 11/28 (2006.01)
H03H 11/04 (2006.01)
(52) U.S. Cl.
CPC ............. *H03H 11/28* (2013.01); *H03H 11/04* (2013.01)

(58) Field of Classification Search
CPC ............................... H03H 11/28; H03H 11/04
See application file for complete search history.

(56) References Cited

FOREIGN PATENT DOCUMENTS

| CN | 103329617 A | * | 9/2013 |
| WO | WO 9519677 A1 | * | 7/1995 |

\* cited by examiner

*Primary Examiner* — Dinh T Le
(74) *Attorney, Agent, or Firm* — Hamre, Schumann, Mueller & Larson, P.C.

(57) ABSTRACT

A method for predicting impedance of a voltage source converter under variable operating points is disclosed, pertaining to the field of analysis of small signal stability in an electrical power system. When the parameters and topology of the control system are fully unknown, the theoretical expression of impedance cannot be applied to a voltage source converter, and impedance is highly dependent on operating points. A fully decoupled impedance model disclosed is constructed in this disclosure. The fully decoupled impedance model decomposes the impedance into a system parameter vector and an operating point vector, and then identifies parameters through impedance measurement, thereby realizing impedance prediction in a voltage source converter grid-connected system under variable operating points when the parameters and topology of the control system are fully unknown, expanding the scope of application of the impedance method and laying a foundation for using the impedance method to analyze small signal stability in engineering practices.

7 Claims, 3 Drawing Sheets

METHOD FOR IMPEDANCE PREDICTION OF A VOLTAGE SOURCE CONVERTER UNDER VARIABLE OPERATING POINTS

TECHNICAL FIELD

The present invention pertains to the field of analysis of small signal stability in an electrical power system and more specifically, relates to a method for impedance prediction of a voltage source converter under variable operating points.

BACKGROUND ART

Due to the increasing pressure from environmental protection and energy resources, a large amount of solar energy, wind energy and distributed power supplies are connected to the grid, and the traditional power system has gradually been transformed into a power-electronics-based power system. As one of the most common devices, voltage source converters (VSC) have been widely used in photovoltaics (PV), wind farms and high-voltage direct current (HVDC) transmission systems. At present, we are facing various serious stability and oscillation problems caused by power electronic devices, so it is very necessary to carry out accurate mathematical modeling and analysis of VSC.

At present, there are two major methods for analyzing small signal stability in a power-electronics-based power system. They are the state-space method in the time domain and the impedance method in the frequency domain. Generally, the state-space model is feasible only when the system structures and parameters are fully known. Similarly, an impedance model of the power electronic devices connected to the grid can be derived theoretically. However, for the sake of trade secrets, we usually are unable to obtain all the structures and parameters of the power electronic devices, while in experiments, the device impedance can also be obtained through injection and sweep frequency measurement of series voltage or shunt current. According to these impedance results and based on the generalized Nyquist stability criterion, the analysis of small signal stability can be further studied. Therefore, the impedance method has been widely used under various practical conditions and has become a dominant method in engineering.

The small signal stability is linearized in a small enough area under a certain operating point and the impedance of the device should be obtained under a specific operating point. Even if there is no change inside the power electronic device, any external changes will cause changes of the operating point of the device, which in turn change the impedance of the device. This makes impedance measurement under variable operating points very time-consuming and tedious, especially when we want to study the stability boundary of the system or look for faults under various operating conditions. Therefore, it is a big challenge to find an appropriate and fast impedance prediction algorithm when the parameters and structures of the power electronic devices are completely unknown and the operating points are variable. So far, there is not any impedance prediction method for the situation where the parameters and structures of power electronic devices are completely unknown. This has directly limited the applicability of the impedance method in engineering practices.

SUMMARY OF THE INVENTION

To address the above defects or improvement demands of the prior art, the present invention provides a method for impedance prediction of a voltage source converter under variable operating points, for the purpose of applying the impedance method in the power electronic devices of which parameters and structures are completely unknown.

In order to achieve the above object, the present invention provides a method for impedance prediction of a voltage source converter under variable operating points, comprising the following steps:

S1. Model small signals of a control system and a filter of a voltage source converter, respectively, and use small signal impedance to construct a fully decoupled impedance model of a voltage source converter grid-connected system, wherein intermediate variables obtained from small signal modeling are all linear functions of operating points, and the completely decoupled impedance model decomposes impedance information into a decoupled form of a coefficient parameter vector and an operating point vector;

S2. Measure impedance information under multiple groups of pre-given operating points at a frequency point that needs to be predicted, and use the measured impedance information to identify the system parameter vector in the fully decoupled impedance model;

S3. Substitute the operating point vector that needs to be predicted into the fully decoupled impedance model to obtain a predicted impedance value under the corresponding operating point.

Further, the small signal impedance is:

$$\begin{bmatrix} g_{i1} & g_{i2} \\ g_{i3} & g_{i4} \end{bmatrix} \begin{bmatrix} -\Delta I_d^s \\ -\Delta I_q^s \end{bmatrix} = \begin{bmatrix} g_{v1} & g_{v2} \\ g_{v3} & g_{v4} \end{bmatrix} \begin{bmatrix} \Delta V_d^s \\ \Delta V_q^s \end{bmatrix}$$

where $\Delta I_d^s$, $\Delta I_q^s$, $\Delta V_d^s$, $\Delta V_q^s$ respectively represent the values of the small signals of the voltage and current at the grid connection point under the dq coordinate system of the system and the direction from the device to the grid connection point is specified as a positive direction of current; and $g_{i1}$, $g_{i2}$, $g_{i3}$, $g_{i4}$, $g_{v1}$, $g_{v2}$, $g_{v3}$, $g_{v4}$ are formed through coupling of system parameters, disturbance frequency and operating point information and are in polynomial nonlinear relations with operating points.

Further, the fully decoupled impedance model is:

$$\begin{cases} Z_{dd} = x^T A_{11} x (x^T A_0 x)^{-1} \\ Z_{dq} = x^T A_{12} x (x^T A_0 x)^{-1} \\ Z_{qd} = x^T A_{21} x (x^T A_0 x)^{-1} \\ Z_{qq} = x^T A_{22} x (x^T A_0 x)^{-1} \end{cases}$$

$$\begin{cases} A_0 = b_1 b_4^T - b_2 b_3^T \\ A_{11} = a_1 b_4^T - a_3 b_2^T \\ A_{12} = a_2 b_4^T - a_4 b_2^T \\ A_{21} = a_3 b_1^T - a_1 b_3^T \\ A_{22} = a_4 b_1^T - a_2 b_3^T \end{cases}$$

x represents a combination of polynomial relations of operating points, where the combination comprises constant terms, first-order terms, quadratic terms and multiple terms; $a_k = [a_{k1} \ a_{k2} \ \ldots \ a_{kL}]^T$; $b_k = [b_{k1} \ b_{k2} \ \ldots \ b_{kL}]^T$, k=1, 2, 3, 4, and L is the length of the operating point vector; and $Z_{dd}$, $Z_{dq}$, $Z_{qd}$, $Z_{qq}$ are four elements of the impedance matrix.

Further, S2 specifically comprises the following steps:

01. Substitute the measured impedance information into the following formula to obtain a coefficient matrix;

$$\begin{cases} M_1 \rho = 0 \\ X^T a_2 = M_2^T [b_1^T \quad b_2^T]^T \\ X^T a_4 = M_2^T [b_3^T \quad b_4^T]^T \end{cases}$$

where $$\begin{cases} m_1 = [-Z_{dd}x^T \quad -Z_{qd}x^T \quad x^T] \\ m_2 = [Z_{dq}x^T \quad Z_{qq}x^T] \\ \rho_1 = [b_1^T \quad b_2^T \quad a_1^T] \\ \rho_2 = [b_3^T \quad b_4^T \quad a_3^T] \end{cases}$$

$M_1 = [m_{11} \, m_{11} \ldots m_{1N}]$, and $m_{1k}$ represents the value of $m_1$ under group k of operating points; $\rho$ represents a set of general solutions of the equation set, and $\rho_1$, $\rho_2$ are solution elements; $X = [x_1 \, x_2 \ldots x_N]$, and $x_k$ represents the value of x under group k of operating points; $M_2 = [m_{21} \, m_{21} \ldots m_{2N}]$, and $m_{2k}$ represents the value of $m_2$ under group k of operating points; and N is the number of groups of pre-given operating points;

02. Solve the linear equation set corresponding to the coefficient matrix, and increase the length of the preset operating point vector and re-solve the equation set if the equation set has less than two systems of fundamental solutions, thereby identifying the system parameter vector in the fully decoupled impedance model.

Further, the number of groups of pre-given operating points meets a precondition: it should ensure that selecting different fundamental systems of solutions from the set $\rho$ of general solutions to constitute $\rho_1$, $\rho_2$ is irrelevant to the impedance prediction result.

Further, when the precondition is not met, the number of given operating points is increased and the linear equation set corresponding to the coefficient matrix is re-solved.

Further, the number of groups of pre-given operating points is 3L−2.

On the whole, compared with the prior art, the above technical solutions conceived by the present invention have the following beneficial effects:

When the parameters and topology of the control system are fully unknown, the theoretical expression of impedance cannot be applied to a voltage source converter, and impedance is highly dependent on operating points, impeding the direct use of the generalized Nyquist criterion from judging small signal stability. The present invention constructs a fully decoupled impedance model, which decomposes impedance into a system parameter vector and an operating point vector, and then identifies parameters through impedance measurement, thereby realizing impedance prediction in a voltage source converter grid-connected system under variable operating points when the parameters and topology of the control system are fully unknown, and laying a foundation for using the impedance method to analyze small signal stability in engineering practices.

DETAILED DESCRIPTION

In order to make the object, technical solutions and advantages of the present invention clearer, the present invention will be further described in detail in conjunction with the drawings and embodiments. It should be understood that the specific embodiments described herein are intended to explain the present invention only and not to limit the present invention. Further, the technical features involved in the embodiments of the present invention described below can be combined with each other as long as they do not conflict with each other.

Figure 1:
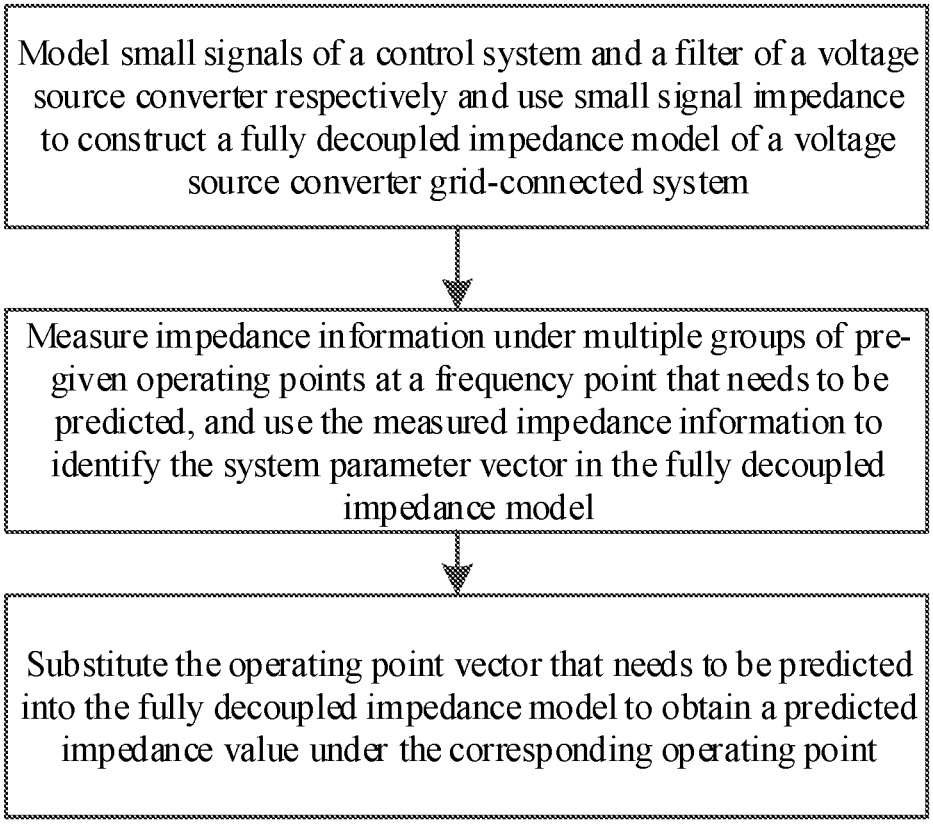
FIG. 1 is a flow diagram of a method for impedance prediction of a voltage source converter under variable operating points provided by the present invention.

As shown in FIG. 1, the present invention discloses a method for impedance prediction of a voltage source converter under variable operating points, comprising the following steps:

S1. Establish a fully decoupled impedance model of a voltage source converter (VSC) grid-connected system according to the definition of small signal impedance, and decompose impedance information into a decoupled form of a coefficient parameter vector and an operating point vector.

Converting three-phase variables to the dq reference system is a very practical means for converter control modeling. No matter what control topology and parameters are contained in the VSC grid-connected system, the system always contains the dq reference system ($d^c$-$q^c$) of the controller and the dq reference system ($d^s$-$q^s$) of the system, and the transformation relationship between the two coordinate systems is determined by matrix $T_{\Delta\theta}$, $$T_{\Delta\theta} = \begin{bmatrix} \cos(\Delta\theta) & \sin(\Delta\theta) \\ -\sin(\Delta\theta) & \cos(\Delta\theta) \end{bmatrix}$$

where $\Delta\theta$ represents an angle difference between the two coordinate systems, which generally is caused by a dynamic process, i.e., in a steady state, $\Delta\theta = 0$. The three-phase voltage and current at the VSC grid connection point are converted to the two dq coordinate systems, respectively, and small signal processing is conducted to obtain $$\begin{bmatrix} \Delta V_d^c \\ \Delta V_q^c \end{bmatrix} = \begin{bmatrix} \Delta V_d^s \\ \Delta V_q^s \end{bmatrix} + \Delta\theta \begin{bmatrix} V_q \\ -V_d \end{bmatrix}$$

$$\begin{bmatrix} \Delta I_d^c \\ \Delta I_q^c \end{bmatrix} = \begin{bmatrix} \Delta I_d^s \\ \Delta I_q^s \end{bmatrix} + \Delta\theta \begin{bmatrix} I_q \\ -I_d \end{bmatrix}$$

$$\begin{bmatrix} \Delta e_d^c \\ \Delta e_q^c \end{bmatrix} = \begin{bmatrix} \Delta e_d^s \\ \Delta e_q^s \end{bmatrix} + \Delta\theta \begin{bmatrix} e_q \\ -e_d \end{bmatrix}$$

where $V_d$, $V_q$, $I_d$, $I_q$ are the steady values of the three-phase voltage and current at the VSC grid connection point in the dq coordinate system, and $e_d$, $e_q$ are the steady values of the inner electric potential of the VSC in the dq coordinate system. $\Delta V_d^c$, $\Delta V_q^c$, $\Delta I_d^c$, $\Delta I_q^c$, $\Delta e_d^c$, $\Delta e_q^c$, $\Delta V_d^s$, $\Delta V_q^s$, $\Delta I_d^s$, $\Delta I_q^s$, $\Delta e_d^s$, $\Delta e_q^s$ respectively correspond to the values of their small signals in the dq reference system of control and the dq reference system of the system.

The control system of the VSC is divided into two parts, which are synchronous links and other control links. The role of the synchronous links is to generate a reference angle θ in the control system, and the role of the other control links is to design a control loop. The reference angle is an angle of the Park transformation from the three-phase coordinate system to the dq coordinate system.

Currently, there are two main types of synchronous links, namely: network construction type and network follower type. The reference angle θ of the network follower type is generated by a phase-locked loop, and the reference angle θ of the network construction type is generated by power imbalance, for example: droop control. Through small signal modeling of different synchronous links, the following general form can be obtained:

$$\Delta\theta = \begin{bmatrix} f_{din} & f_{qin} \\ f_{did} & f_{qid} \end{bmatrix} \begin{bmatrix} \Delta I_d^s \\ \Delta I_q^s \end{bmatrix} + \begin{bmatrix} f_{dvn} & f_{qvn} \\ f_{dvd} & f_{qvd} \end{bmatrix} \begin{bmatrix} \Delta V_d^s \\ \Delta V_q^s \end{bmatrix}$$

where $f_{din}$, $f_{did}$, $f_{qin}$, $f_{qid}$, $f_{dvn}$, $f_{dvd}$, $f_{qvn}$, $f_{qvd}$ are linear functions of operating point ($V_d$, $V_q$, $I_d$, $I_q$). Generally, $V_q$=0, $V_d$=$V_t$, and $V_t$ is the amplitude of the voltage at the grid connection point.

For the other control links, after the operating point is linearized, all intermediate variables are linear functions of the operating point, i.e., $$\begin{bmatrix} \Delta e_d^c \\ \Delta e_q^c \end{bmatrix} = \begin{bmatrix} f_{ic1} & f_{ic2} \\ f_{ic3} & f_{ic4} \end{bmatrix} \begin{bmatrix} \Delta I_d^c \\ \Delta I_q^c \end{bmatrix} + \begin{bmatrix} f_{is1} & f_{is2} \\ f_{is3} & f_{is4} \end{bmatrix}$$

$$\begin{bmatrix} \Delta I_d^s \\ \Delta I_q^s \end{bmatrix} + \begin{bmatrix} f_{vc1} & f_{vc2} \\ f_{vc3} & f_{vc4} \end{bmatrix} \begin{bmatrix} \Delta V_d^c \\ \Delta V_q^c \end{bmatrix} + \begin{bmatrix} f_{vs1} & f_{vs2} \\ f_{vs3} & f_{vs4} \end{bmatrix} \begin{bmatrix} \Delta V_d^s \\ \Delta V_q^s \end{bmatrix}$$

where $f_{ic1\sim4}$, $f_{is1\sim4}$, $f_{vc1\sim4}$, $f_{vs1\sim4}$ are all linear functions of operating point ($V_t$, $I_d$, $I_q$). Further, through small signal modeling of the VSC filter, we may get $$\begin{bmatrix} \Delta e_d^s \\ \Delta e_q^s \end{bmatrix} = \begin{bmatrix} f_{li1} & f_{li2} \\ f_{li3} & f_{li4} \end{bmatrix} \begin{bmatrix} \Delta I_d^s \\ \Delta I_q^s \end{bmatrix} + \begin{bmatrix} f_{lv1} & f_{lv2} \\ f_{lv3} & f_{lv4} \end{bmatrix} \begin{bmatrix} \Delta V_d^s \\ \Delta V_q^s \end{bmatrix}$$

where $f_{li1\sim4}$, $f_{lv1\sim4}$ are all linear functions of the operating point ($V_t$, $I_d$, $I_q$). The above formulae are combined and $\Delta e_d^s$, $\Delta e_q^s$, $\Delta e_d^c$, $\Delta e_q^c$ are cancelled to obtain:

$$\begin{bmatrix} f_{i1} & f_{i2} \\ f_{i3} & f_{i4} \end{bmatrix} \begin{bmatrix} -\Delta I_d^s \\ -\Delta I_q^s \end{bmatrix} = \begin{bmatrix} f_{v1} & f_{v2} \\ f_{v3} & f_{v4} \end{bmatrix} \begin{bmatrix} \Delta V_d^s \\ \Delta V_q^s \end{bmatrix} + \Delta\theta \begin{bmatrix} f_{d\theta} \\ f_{q\theta} \end{bmatrix}$$

where $$\begin{cases} f_{i1} = f_{li1} - f_{ic1} - f_{is1}, f_{i2} = f_{li2} - f_{ic2} - f_{is2} \\ f_{i3} = f_{li3} - f_{ic3} - f_{is3}, f_{i4} = f_{li4} - f_{ic4} - f_{is4} \\ f_{v1} = f_{lv1} - f_{vc1} - f_{vs1}, f_{v2} = f_{lv2} - f_{vc2} - f_{vs2} \\ f_{v3} = f_{lv3} - f_{vc3} - f_{vs3}, f_{v4} = f_{lv4} - f_{vc4} - f_{vs4} \\ f_{d\theta} = e_q - f_{ic1}I_q + f_{ic2}, I_d + f_{vc2}V_t \\ f_{q\theta} = -e_d - f_{ic3}I_q + f_{ic4}, I_d + f_{vc4}V_t \end{cases}$$

Apparently, $f_{i1\sim4}$, $f_{v1\sim4}$ are all linear functions of the operating point ($V_t$, $I_d$, $I_q$). In particular, as $e_d$, $e_q$ can be linearly expressed with the operating point, $f_{d\theta}$, $f_{q\theta}$ are also linear functions of the operating point.

By substituting the $\Delta\theta$ expression in the synchronous links into the above formula, we get $$\begin{bmatrix} g_{i1} & g_{i2} \\ g_{i3} & g_{i4} \end{bmatrix} \begin{bmatrix} -\Delta I_d^s \\ -\Delta I_q^s \end{bmatrix} = \begin{bmatrix} g_{v1} & g_{v2} \\ g_{v3} & g_{v4} \end{bmatrix} \begin{bmatrix} \Delta V_d^s \\ \Delta V_q^s \end{bmatrix}$$

where $$\begin{cases} g_{i1} = (f_{i1}f_{did} + f_{d\theta}f_{din})f_{qid}f_{dvd}f_{qvd} \\ g_{i2} = (f_{i2}f_{qid} + f_{d\theta}f_{qin})f_{did}f_{dvd}f_{qvd} \\ g_{i3} = (f_{i1}f_{did} + f_{d\theta}f_{din})f_{qid}f_{dvd}f_{qvd} \\ g_{i4} = (f_{i4}f_{qid} + f_{q\theta}f_{qin})f_{did}f_{dvd}f_{qvd} \\ g_{v1} = (f_{v1}f_{dvd} + f_{d\theta}f_{dvn})f_{did}f_{qid}f_{qvd} \\ g_{v2} = (f_{v2}f_{qvd} + f_{d\theta}f_{qvn})f_{did}f_{qid}f_{dvd} \\ g_{v3} = (f_{v3}f_{dvd} + f_{q\theta}f_{dvn})f_{did}f_{qid}f_{qvd} \\ g_{v4} = (f_{v4}f_{qvd} + f_{q\theta}f_{qvn})f_{did}f_{qid}f_{dvd} \end{cases}$$

It can be seen that $g_{i1\sim4}$, $g_{v1\sim4}$ have polynomial nonlinear relations with the operating point. The preset operating point vector contains the constant terms, first-order terms, quadratic terms and multiple terms of the operating point, and the length is L. They are written in a vector form to obtain:

$$\begin{cases} g_{ik} = a_k^T x \\ g_{ik} = b_k^T x \end{cases}, k = 1, 2, 3, 4$$

where x represents a combination of polynomial relations of operating points, $a_k$=$[a_{k1}\ a_{k2}\ \ldots\ a_{kL}]^T$; $b_k$=$[b_{k1}\ b_{k2}\ \ldots\ b_{kL}]^T$; supposing L=10, then:

$$\begin{cases} x = [1\ I_d\ I_q\ V_t\ I_d^2\ I_q^2\ I_dI_q\ I_dV_t\ I_qV_t\ V_t^2]^T \\ a_k = [a_{k1}\ a_{k2}\ a_{k3}\ a_{k4}\ a_{k5}\ a_{k6}\ a_{k7}\ a_{k8}\ a_{k9}\ a_{k10}]^T \\ b_k = [b_{k1}\ b_{k2}\ b_{k3}\ b_{k4}\ b_{k5}\ b_{k6}\ b_{k7}\ b_{k8}\ b_{k9}\ b_{k10}]^T \end{cases}$$

where $a_k$, $b_k$ are system parameter vectors and $a_{k1\sim10}$, $b_{k1\sim10}$ are system vector parameters relevant to system parameters and disturbance frequency only.

The definition of impedance matrix Z may be written into:

$$\begin{bmatrix} \Delta V_d^s \\ \Delta V_q^s \end{bmatrix} = \begin{bmatrix} Z_{dd} & Z_{dq} \\ Z_{qd} & Z_{qq} \end{bmatrix} \begin{bmatrix} -\Delta I_d^s \\ -\Delta I_q^s \end{bmatrix}$$

where $Z_{dd}$, $Z_{dq}$, $Z_{qd}$, $Z_{qq}$ are four elements of the impedance matrix, and the expression is as follows:

$$\begin{cases} Z_{dd} = (g_{i1}g_{v4} - g_{v2}g_{i3})\Delta_{gv}^{-1} \\ Z_{dq} = (g_{i2}g_{v4} - g_{v2}g_{i4})\Delta_{gv}^{-1} \\ Z_{qd} = (g_{i3}g_{v1} - g_{v3}g_{i1})\Delta_{gv}^{-1} \\ Z_{qq} = (g_{i4}g_{v1} - g_{v3}g_{i2})\Delta_{gv}^{-1} \end{cases}$$

where $\Delta_{gv}$=$g_{v1}g_{v4}$-$g_{v2}g_{v3}$.

Thus, the fully decoupled impedance model is:

$$\begin{cases} Z_{dd} = x^T A_{11} x (x^T A_0 x)^{-1} \\ Z_{dq} = x^T A_{12} x (x^T A_0 x)^{-1} \\ Z_{qd} = x^T A_{21} x (x^T A_0 x)^{-1} \\ Z_{qq} = x^T A_{22} x (x^T A_0 x)^{-1} \end{cases}$$

where $$\begin{cases} A_0 = b_1 b_4^T - b_2 b_3^T \\ A_{11} = b_1 b_4^T - a_3 b_2^T \\ A_{12} = b_2 b_4^T - a_4 b_2^T \\ A_{21} = b_3 b_1^T - a_1 b_3^T \\ A_{22} = b_4 b_1^T - a_2 b_3^T \end{cases}$$

S2. Measure impedance information under multiple groups of pre-given operating points at a frequency point that needs to be predicted and obtain a coefficient matrix through substitution. Solve the linear equation set corresponding to the coefficient matrix, and increase the length of the preset operating point vector and re-solve the equation set if the equation set has less than two systems of fundamental solutions, thereby identifying the system parameter vector in the fully decoupled impedance model.

According to the above derivation, we can get:

$$\begin{cases} g_{i1}\Delta I_d^s + g_{i2}\Delta I_q^s + g_{v1}\Delta V_d^s + g_{v2}\Delta V_q^s = 0 \\ g_{i3}\Delta I_d^s + g_{i4}\Delta I_q^s + g_{v3}\Delta V_d^s + g_{v4}\Delta V_q^s = 0 \end{cases}$$

According to the definition of impedance, we can get:

$$\begin{cases} \Delta V_d^s = -Z_{dd}\Delta I_d^s - Z_{dq}\Delta I_q^s \\ \Delta V_q^s = -Z_{qd}\Delta I_d^s - Z_{qq}\Delta I_q^s \end{cases}$$

By substitution, we may get:

$$\begin{cases} \sum_1 \Delta I_d^s + \sum_2 \Delta I_q^s = 0 \\ \sum_3 \Delta I_d^s + \sum_4 \Delta I_q^s = 0 \end{cases}$$

where $$\begin{cases} \sum_1 = -Z_{dd} g_{v1} - Z_{qd} g_{v2} + g_{i1} \\ \sum_2 = -Z_{dq} g_{v1} - Z_{qq} g_{v2} + g_{i2} \\ \sum_3 = -Z_{dd} g_{v3} - Z_{qd} g_{v4} + g_{i3} \\ \sum_4 = -Z_{dq} g_{v3} - Z_{qq} g_{v4} + g_{i4} \end{cases}$$

As the above equation is tenable under any disturbance, $\Delta I_d^s$, $\Delta I_q^s$, may be any value, i.e., when and only when:

$$\begin{cases} \sum_1 = 0, \sum_2 = 0 \\ \sum_2 = 0, \sum_3 = 0 \end{cases}$$

by substituting the vector forms of $g_{i1\sim4}$, $g_{v1\sim4}$, we may get:

$$\begin{cases} -Z_{dd} b_1^T x - Z_{qd} b_2^T x + a_1^T x = 0 \\ -Z_{dq} b_1^T x - Z_{qq} b_2^T x + a_2^T x = 0 \\ -Z_{dd} b_3^T x - Z_{qd} b_4^T x + a_3^T x = 0 \\ -Z_{dq} b_3^T x - Z_{qq} b_4^T x + a_4^T x = 0 \end{cases}$$

By sorting it into a matrix form, we may get $$\begin{cases} m_1^T \rho_1 = 0 \\ m_1^T \rho_2 = 0 \\ x^T a_2 = m_2^T [b_1^T \ b_2^T]^T \\ x^T a_4 = m_2^T [b_3^T \ b_4^T]^T \end{cases}$$

where $$\begin{cases} m_1 = [-Z_{dd} x^T \ -Z_{qd} x^T \ x^T] \\ m_2 = [Z_{dq} x^T \ Z_{qq} x^T] \\ \rho_1 = [b_1^T \ b_2^T \ a_1^T] \\ \rho_2 = [b_3^T \ b_4^T \ a_3^T] \end{cases}$$

By substituting the known operating point vector in group 3L−2 and the measured corresponding impedance information, we get an equation set:

$$\begin{cases} M_1 \rho = 0 \\ X^T a_2 = M_2^T [b_1^T \ b_2^T]^T \\ X^T a_4 = M_2^T [b_3^T \ b_4^T]^T \end{cases}$$

where $M_1=[m_{11} \ m_{11} \ \ldots \ m_{1N}]$, and $m_{1k}$ represents the value of $m_1$ under group k of operating points; $X=[x_1 \ x_2 \ \ldots \ x_N]$, and $x_k$ represents the value of x under group k of operating points; $M_2=[m_{21} \ m_{21} \ \ldots \ m_{2N}]$, and $m_{2k}$ represents the value of $m_2$ under group k of operating points; and N is the number of groups of known operating points, i.e., 3L−2. $\rho$ represents a set of general solutions of the equation set and $\rho_1$, $\rho_2$ are solution elements. The equation set $M_1\rho=0$ is solved at first to obtain $\rho_1$, $\rho_2$, and then the obtained $b_{1\sim4}$ is substituted into two remaining inhomogeneous equations to obtain all system parameter vectors, i.e., $a_{1\sim4}$, $b_{1\sim4}$ in the fully decoupled impedance model.

The preset operating point vector x contains the constant terms, first-order terms and quadratic terms of the operating point and this assumption may have too many terms, so the equation set $M_1\rho=0$ may have excessive free variables, in other words, this homogenous equation set has more than two systems of fundamental solutions. Below we will discuss whether selecting different $\rho_1$, $\rho_2$ from the set $\rho$ of systems of fundamental solutions will affect the final impedance result.

Define two vectors, $$\begin{cases} \alpha = [b_1^T \ b_2^T \ a_1^T \ a_2^T] \\ \beta = [b_3^T \ b_4^T \ a_3^T \ a_4^T] \end{cases}$$

For easy writing, define:

$$\begin{cases} \alpha = k_1\eta_1 + k_2\eta_2 + \ldots + k_n\eta_n \\ \beta = k_1'\eta_1 + k_2'\eta_2 + \ldots + k_n'\eta_n \end{cases}$$

where $\eta_{1 \sim n}$ is obtained by combining $a_{1 \sim 4}$, which are obtained by selecting different systems of fundamental solutions from the set $\rho$ of systems of fundamental solutions to constitute $\rho_1$, $\rho_2$, and then substituting the $\rho_1$, $\rho_2$ into two remaining inhomogeneous equation sets; $k_{1 \sim n}$, $k_{1 \sim n}'$ are any coefficients. It should ensure that selecting different fundamental systems of solutions from the set $\rho$ of systems of fundamental solutions to constitute $\rho_1$, $\rho_2$ is irrelevant to the impedance prediction result; in other words, the selection of $k_{1 \sim n}$, $k_{1 \sim n}'$ does not affect the final impedance prediction.

Definition: $E_j = [H_1^T \ H_2^T \ H_3^T \ H_4^T]$, $j=1, 2, 3, 4$, where when $i=j$ $H_i = I_{10 \times 10}$, and when $i \neq j$, $H_i = O_{10 \times 10}$. Therefore, we may get:

$$\begin{cases} b_1 = E_1\alpha, \ b_2 = E_2\alpha, \ a_1 = E_3\alpha, \ a_2 = E_4\alpha \\ b_3 = E_1\beta, \ b_4 = E_2\beta, \ a_3 = E_3\beta, \ a_4 = E_4\beta \end{cases}$$

According to the definitions of $A_0$, $A_{11}$, $A_{12}$, $A_{21}$, $A_{22}$ in the fully decoupled impedance model:

$$\begin{cases} A_0 = b_1 b_4^T - b_2 b_3^T \\ A_{11} = a_1 b_4^T - a_3 b_2^T \\ A_{12} = a_2 b_4^T - a_4 b_2^T \\ A_{21} = a_3 b_1^T - a_1 b_3^T \\ A_{22} = a_4 b_1^T - a_2 b_3^T \end{cases}$$

we may get:

$$\begin{cases} A_0 = \sum_{i=1}^{n}\sum_{j=1}^{n}(k_i k_j' - k_j k_i') E_1 (\eta_i \eta_j^T - \eta_j \eta_i^T) E_2^T \\ A_{11} = \sum_{i=1}^{n}\sum_{j=1}^{n}(k_i k_j' - k_j k_i') E_3 (\eta_i \eta_j^T - \eta_j \eta_i^T) E_2^T \\ A_{12} = \sum_{i=1}^{n}\sum_{j=1}^{n}(k_i k_j' - k_j k_i') E_4 (\eta_i \eta_j^T - \eta_j \eta_i^T) E_2^T \\ A_{21} = \sum_{i=1}^{n}\sum_{j=1}^{n}(k_i k_j' - k_j k_i') E_1 (\eta_i \eta_j^T - \eta_j \eta_i^T) E_3^T \\ A_{22} = \sum_{i=1}^{n}\sum_{j=1}^{n}(k_i k_j' - k_j k_i') E_1 (\eta_i \eta_j^T - \eta_j \eta_i^T) E_4^T \end{cases}$$

Take the calculation of impedance $Z_{dd}$ as an example:

$$Z_{dd} = x^T A_{11} x (x^T A_0 x)^{-1} = \frac{\sum_{i=1}^{n}\sum_{j=1}^{n}(k_i k_j' - k_j k_i') E_3 (\eta_i \eta_j^T - \eta_j \eta_i^T) E_2^T}{\sum_{i=1}^{n}\sum_{j=1}^{n}(k_i k_j' - k_j k_i') E_1 (\eta_i \eta_j^T - \eta_j \eta_i^T) E_2^T},$$

to ensure the result of $Z_{dd}$ is not affected by $k_{1 \sim n}$, $k_{1 \sim n}'$, a precondition is when and only when $$\frac{(k_i k_j' - k_j k_i') E_3 (\eta_i \eta_j^T - \eta_j \eta_i^T) E_2^T}{(k_i k_j' - k_j k_i') E_1 (\eta_i \eta_j^T - \eta_j \eta_i^T) E_2^T}$$

is the same for any i, j. Therefore, after the systems of fundamental solutions of $M_1\rho=0$ are obtained, they should be verified through substitution. In fact, as long as the difference between known operating point vectors is large, this precondition can be met. If it is found that this precondition is not met, the number of known operating points is increased and re-solving is conducted. In addition, if the equation set $M_1\rho=0$ has less than two systems of fundamental solutions, it means that our assumption of polynomial relations of operating points in a preset operating point vector is not enough. In response, the length of the preset operating point vector is increased, for example, a cubic term ($I_d^2 I_q$, $I_d^3$ . . . ) is added.

Hence, we get an operating point parameter vector $a_{1 \sim 4}$, $b_{1 \sim 4}$ of the impedance complete solution model.

S3. Substitute the operating point vector that needs to be predicted into the model to obtain predicted impedance under any operating point.

Substitute any group of operating point vectors that need to predict impedance, i.e., polynomial vectors constituted by the voltage and current at the grid connection point $x^* = [1 \ I_d \ I_q \ V_t \ I_d^2 \ I_q^2 \ I_d I_q \ I_d V_t \ I_q V_t \ V_t^2]^T$, to obtain the following predicted impedance:

$$\begin{cases} Z_{dd} = x^{*T} A_{11} x^* (x^{*T} A_0 x^*)^{-1} \\ Z_{dq} = x^{*T} A_{12} x^* (x^{*T} A_0 x^*)^{-1} \\ Z_{qd} = x^{*T} A_{21} x^* (x^{*T} A_0 x^*)^{-1} \\ Z_{qq} = x^{*T} A_{22} x^* (x^{*T} A_0 x^*)^{-1} \end{cases}$$

where $$\begin{cases} A_0 = b_1 b_4^T - b_2 b_3^T \\ A_{11} = a_1 b_4^T - a_3 b_2^T \\ A_{12} = a_2 b_4^T - a_4 b_2^T \\ A_{21} = a_3 b_1^T - a_1 b_3^T \\ A_{22} = a_4 b_1^T - a_2 b_3^T \end{cases}$$

Compared with the prior art, the present invention has considered that when the parameters and topology of the control system are fully unknown, the theoretical expression of impedance cannot be applied to a voltage source converter, and impedance is highly dependent on operating points, impeding the direct use of the generalized Nyquist criterion from judging small signal stability, and can analyze small signal stability of a voltage source converter grid-connected system with completely unknown structures and parameters, expanding the scope of application of the impedance method.

In order for those skilled in the art to better understand the present invention, we will describe in detail the use of a calculation method for impedance prediction of a voltage source converter under variable operating points provided by the present invention in impedance prediction in conjunction with specific embodiments.

Embodiment

A typical VSC grid-connected test system is selected. The system adopts a phase-locked loop (PLL) 6 as a synchronous link and adopts terminal voltage and DC voltage outer loop control (DVC&TVC) 14 and AC current inner loop control (ACC) 12. Through 30 groups of known operating point vector and impedance information, the system performs impedance prediction of the operating point vectors that need to be predicted.

Figure 2:
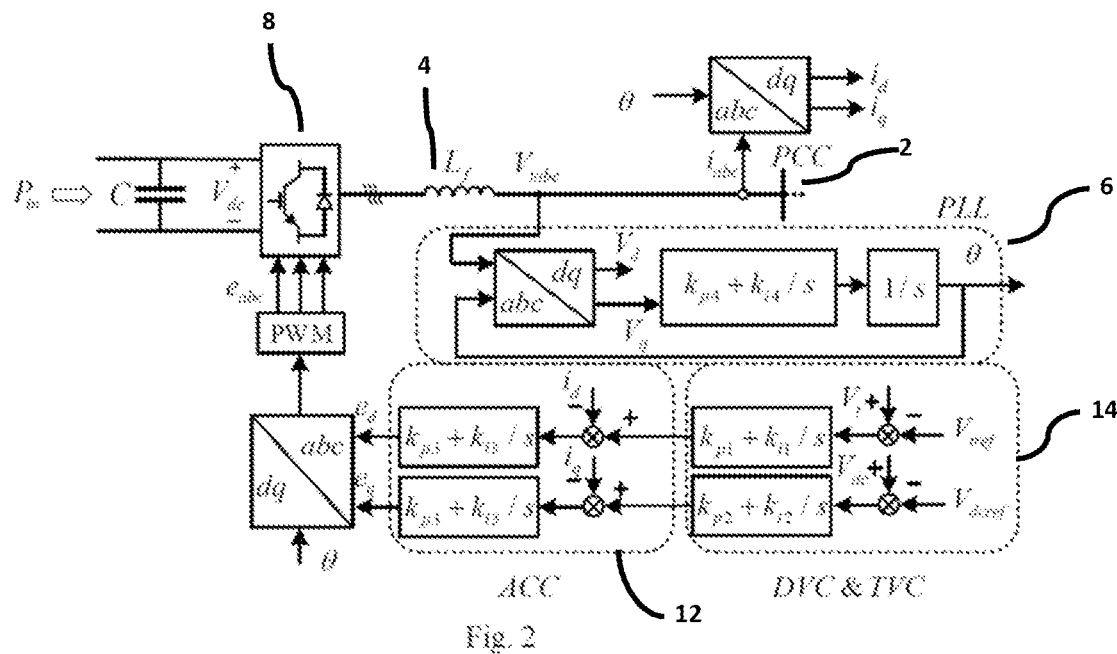
FIG. 2 is a schematic view of a typical voltage source converter (VSC) grid-connected test system provided by an embodiment of the present invention.

The system is a shown in FIG. 2, where $L_f$ represents filter inductance of a filter 4, C represents DC side capacitance, $P_m$ is power input from the DC side, $e_{abc}$ is three-phase inner electric potential of VSC 8, $V_{tabc}$ is three-phase voltage at the grid connection point 2, $i_{abc}$ is three-phase current at the grid connection point 2, $V_d$, $V_q$, $i_d$, $i_q$ are the values of the three-phase voltage and current at the grid connection point 2 under the dq coordinate system, $e_d$, $e_q$ are the values of $e_{abc}$ under the dq coordinate system, $V_t$ is the amplitude of $V_{tabc}$, $V_{dc}$ is capacitive voltage on the DC side, θ is an angle output of the phase-locked loop, $i_{dref}$, $i_{qref}$ are the reference values of $i_d$, $i_q$, $V_{tref}$, $V_{dcref}$ are the reference values of $V_t$, $V_{dc}$, and $k_{p1-4}$, $k_{i1-4}$ are parameters of PI control. The parameters used in this embodiment are all expressed in a per unit system, the base value of power is $S_{base}$=2MVA, and the base value of voltage is $V_{base}$=690V. The parameters of the controller PI are as follows: $k_{p1}$=3.5, $k_{i1}$=140, $k_{p2}$=1, $k_{i2}$=100, $k_{p3}$=0.3, $k_{i3}$=160, $k_{p4}$=50, $k_{i4}$=2000. The 28 groups of known operating point information are as shown in Table 1.

TABLE 1

| No. | $V_t$(pu) | P(pu) | Q(pu) |
|---|---|---|---|
| 1 | 0.9704 | 0.8219 | 0.6769 |
| 2 | 0.9657 | 0.6050 | 0.7701 |
| 3 | 0.6392 | 0.3496 | −0.5849 |
| 4 | 0.9824 | 0.1548 | −0.9247 |
| 5 | 0.9786 | 0.4750 | −0.5887 |
| 6 | 0.5709 | 0.2408 | −0.4747 |
| 7 | 0.8961 | 0.8598 | −0.2791 |
| 8 | 0.5179 | 0.4397 | −0.4495 |
| 9 | 0.8394 | 0.6360 | −0.4082 |
| 10 | 0.6961 | 0.4563 | 0.4578 |
| 11 | 0.8530 | 0.0272 | 0.3806 |
| 12 | 0.5231 | 0.0508 | −0.3384 |
| 13 | 0.8474 | 0.2687 | −0.7630 |
| 14 | 0.5172 | 0.2269 | 0.1225 |
| 15 | 0.8828 | 0.7020 | 0.5528 |
| 16 | 0.7449 | 0.3319 | −0.2180 |
| 17 | 0.8547 | 0.6450 | 0.3829 |
| 18 | 0.8399 | 0.5502 | 0.5667 |
| 19 | 0.5595 | 0.2788 | −0.5145 |
| 20 | 0.6702 | 0.3922 | 0.3702 |
| 21 | 0.8756 | 0.2234 | −0.1004 |
| 22 | 0.8495 | 0.7569 | −0.7804 |
| 23 | 0.7736 | 0.1072 | 0.5426 |
| 23 | 0.6288 | 0.5286 | 0.3090 |
| 25 | 0.9071 | 0.2209 | −0.7788 |
| 26 | 0.6750 | 0.1327 | 0.3360 |
| 27 | 0.8080 | 0.3824 | 0.2397 |
| 28 | 0.9154 | 0.5358 | −0.0910 |

Figure 3:
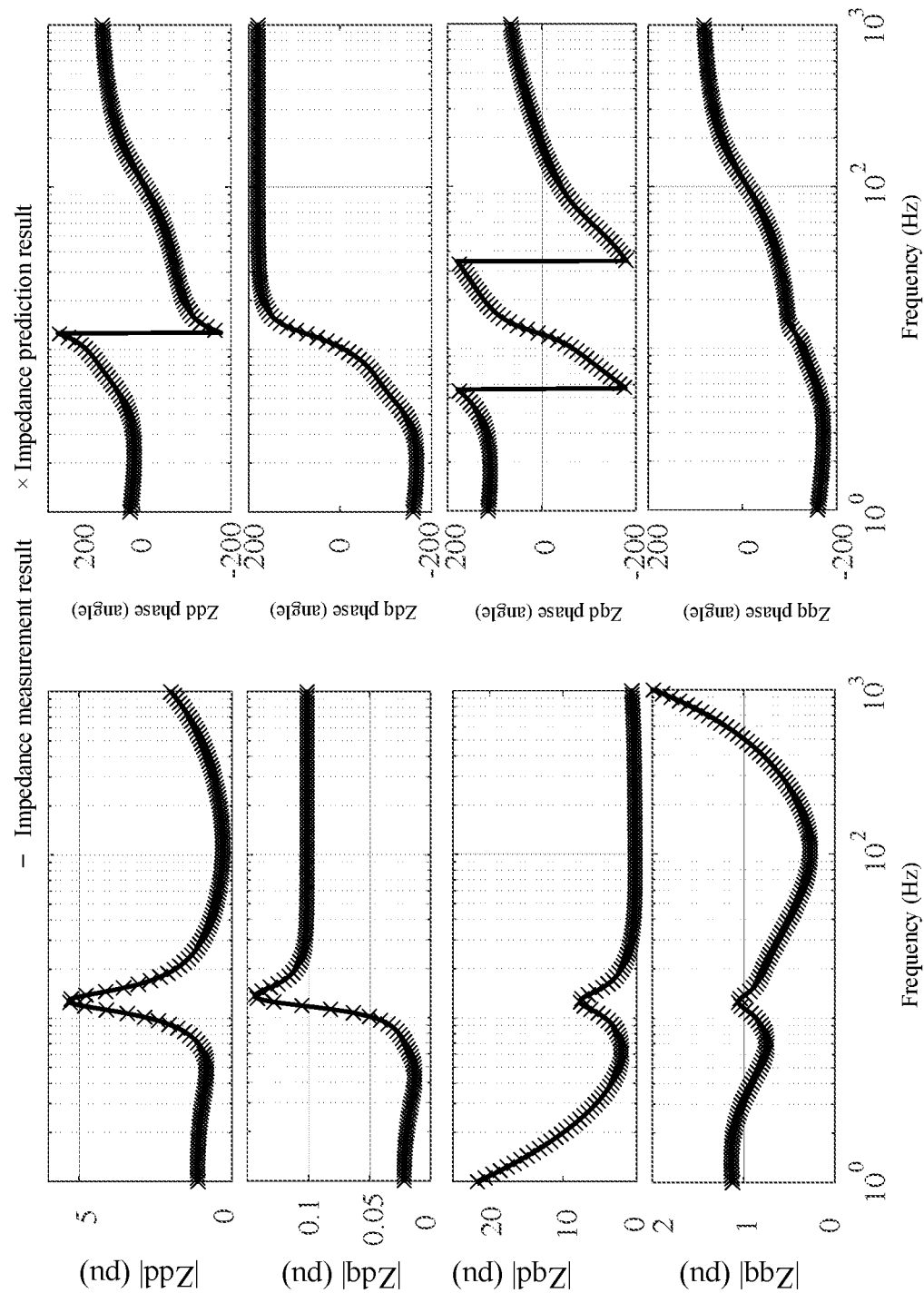
FIG. 3 is a comparison diagram of an impedance prediction result at a preset operating point provided by an embodiment of the present invention and an impedance measurement result.

The operating point that needs to be predicted is: $V_t$=1.0000, P=0.8000, Q=0.0160. The impedance prediction result and the impedance measurement results under this group of operating points are shown in FIG. 3. It can be seen that the predicted impedance is very consistent with the measured impedance, proving that the fully decoupled impedance model constructed in the present invention is accurate and can accurately predict the impedance under any operating point.

It can be easily understood by those skilled in the art that the foregoing description includes only preferred embodiments of the present invention and is not intended to limit the present invention. All the modifications, identical replacements and improvements within the spirit and principle of the present invention should be in the scope of protection of the present invention.

What is claimed is:

1. A method for predicting impedance of a voltage source converter (VSC) under changing operating points, comprising:

S1. providing a voltage source converter grid-connected system comprising a control system and a filter of a voltage source converter (VSC) connected to a grid at a VSC grid connection point to output voltage $V_{tabc}$ and current $i_{abc}$ with small signals at the grid connection point, the step S1 further comprising constructing a decoupled impedance model of the voltage source converter grid-connected system under the changing operating points, wherein constructing the decoupled impedance model comprises obtaining variables for a small signal impedance of the system, the variables are all linear functions of the changing operating points, and decomposing the small signal impedance into a decoupled form of a system parameter vector and an operating point vector;

S2. measuring the voltage $V_{tabc}$ and the current $i_{abc}$ at the VSC grid connection point to determine impedance values of the VSC under multiple groups of pre-given operating points at a frequency point that needs to be predicted, and using the determined impedance values to identify the system parameter vector in the decoupled impedance model; and S3. using the decoupled impedance model with the identified system parameter vector, substituting the operating point vector for an operating point that needs to be predicted into the decoupled impedance model to obtain a predicted impedance value under the corresponding operating point.

2. The method of predicting impedance of a voltage source converter under changing operating points according to claim 1, wherein obtaining variables for a small signal impedance of the system comprises representing the small signal impedance as:

$$\begin{bmatrix} g_{I1} & g_{I2} \\ g_{I3} & g_{I4} \end{bmatrix} \begin{bmatrix} -\Delta I_d^s \\ \Delta I_q^s \end{bmatrix} = \begin{bmatrix} g_{v1} & g_{v2} \\ g_{v3} & g_{v4} \end{bmatrix} \begin{bmatrix} \Delta V_d^s \\ \Delta V_q^s \end{bmatrix}$$

where $\Delta I_d^s$, $\Delta I_q^s$, $\Delta V_d^s$, $\Delta V_q^s$ respectively represent the values of the small signals of the voltage and current at the grid connection point under a dq coordinate system and the direction from the voltage source converter to the grid connection point is specified as a positive direction of current; and $g_{i1}$, $g_{i2}$, $g_{i3}$, $g_{i4}$, $g_{v1}$, $g_{v2}$, $g_{v3}$, $g_{v4}$ are formed through coupling of system parameters, disturbance frequency and operating point information and are in polynomial nonlinear relations with operating points.

3. The method for predicting impedance of a voltage source converter under changing operating points according to claim 2, wherein constructing the decoupled impedance model further comprises representing the decoupled impedance model as:

$$\begin{cases} Z_{dd} = x^T A_{11} x (x^T A_0 x)^{-1} \\ Z_{dq} = x^T A_{12} x (x^T A_0 x)^{-1} \\ Z_{qd} = x^T A_{21} x (x^T A_0 x)^{-1} \\ Z_{qq} = x^T A_{22} x (x^T A_0 x)^{-1} \end{cases}$$

$$\begin{cases} A_0 = b_1 b_4^T - b_2 b_3^T \\ A_{11} = a_1 b_4^T - a_3 b_2^T \\ A_{12} = a_2 b_4^T - a_4 b_2^T \\ A_{21} = a_3 b_1^T - a_1 b_3^T \\ A_{22} = a_4 b_1^T - a_2 b_3^T \end{cases}$$

x represents a combination of polynomial relations of operating points, where the combination comprises constant terms, first-order terms, quadratic terms and multiple terms; $a_k = [a_{k1}\ a_{k2}\ \ldots\ a_{kL}]^T$; $b_k = [b_{k1}\ b_{k2}\ \ldots\ b_{kL}]^T$, k=1, 2, 3, 4, and L is the length of the operating point vector; and $Z_{dd}, Z_{dq}, Z_{qd}, Z_{qq}$ are four elements of the impedance matrix.

4. The method for predicting impedance of a voltage source converter under changing operating points according to claim 3, wherein S2 comprises the following steps:
01. Substituting the determined impedance values into the following formula to obtain a coefficient matrix;

$$\begin{cases} M_1 \rho = 0 \\ X^T a_2 = M_2^T [b_1^T\ b_2^T]^T \\ X^T a_4 = M_2^T [b_3^T\ b_4^T]^T \end{cases}$$

where $$\begin{cases} m_1 = [-Z_{dd} x^T\ -Z_{qd} x^T\ x^T] \\ m_2 = [Z_{dq} x^T\ Z_{qq} x^T] \\ \rho_1 = [b_1^T\ b_2^T\ a_1^T] \\ \rho_2 = [b_3^T\ b_4^T\ a_3^T] \end{cases}$$

$M_1 = [m_{11}\ m_{11}\ \ldots\ m_{1N}]$, and $m_{1k}$ represents the value of $m_1$ under group k of operating points; ρ represents a set of general solutions of the equation set, and $\rho_1, \rho_2$ are solution elements; $X=[x_1\ x_2\ \ldots\ x_N]$, and $x_k$ represents the value of x under group k of operating points; $M_2=[m_{21}\ m_{21}\ \ldots\ m_{2N}]$, and $m_{2k}$ represents the value of $m_2$ under group k of operating points; and N is the number of groups of pre-given operating points; and 02. Solving the linear equation set corresponding to the coefficient matrix, and increasing the length of the preset operating point vector and re-solve the equation set if the equation set has less than two systems of fundamental solutions, thereby identifying the system parameter vector in the decoupled impedance model.

5. The method for predicting impedance of a voltage source converter under changing operating points according to claim 4, wherein the number of groups of pre-given operating points meets a precondition: it should ensure that selecting different fundamental systems of solutions from the set ρ of general solutions to constitute $\rho_1, \rho_2$ is irrelevant to the impedance prediction result.

6. The method for predicting impedance of a voltage source converter under changing operating points according to claim 4, wherein when the precondition is not met, the number of given operating points is increased and the linear equation set corresponding to the coefficient matrix is re-solved.

7. The method for predicting impedance of a voltage source converter under changing operating points according to claim 5, wherein the number of groups of pre-given operating points is 3L−2.

\* \* \* \* \*